United States Patent
Kobayashi

Patent Number: 5,366,912
Date of Patent: Nov. 22, 1994

[54] FABRICATION METHOD OF THIN-FILM TRANSISTOR

[75] Inventor: Kenichi Kobayashi, Kanagawa, Japan

[73] Assignee: Fuji Xerox Co., Ltd., Tokyo, Japan

[21] Appl. No.: 409,803

[22] Filed: Sep. 20, 1989

[30] Foreign Application Priority Data

Sep. 21, 1988 [JP] Japan .................... 63-234712

[51] Int. Cl.$^5$ ............... H01L 21/336; H01L 21/84
[52] U.S. Cl. ........................... 437/40; 437/41; 437/101; 437/228; 156/652; 156/663; 257/53; 257/57
[58] Field of Search ............ 437/40, 41, 101, 228; 357/2, 4, 23.7; 156/650, 651, 652, 643, 663; 257/53, 57

[56] References Cited

U.S. PATENT DOCUMENTS

| | | | |
|---|---|---|---|
| 3,840,695 | 10/1974 | Fischer | 357/4 |
| 4,543,320 | 9/1985 | Vijan | 156/643 |
| 4,700,458 | 10/1987 | Suzuki et al. | 437/41 |
| 4,704,783 | 11/1987 | Possin et al. | 156/643 |
| 4,720,736 | 1/1988 | Takafuji et al. | 357/23.7 |
| 4,774,207 | 9/1988 | Possin | 156/662 |
| 4,778,560 | 10/1988 | Takeda et al. | 357/23.7 |
| 4,862,234 | 8/1989 | Koden | 357/23.7 |
| 4,885,616 | 12/1989 | Ohta | 357/23.7 |

FOREIGN PATENT DOCUMENTS

| | | | |
|---|---|---|---|
| 0019378 | 1/1984 | Japan | 437/101 |
| 0149060 | 8/1984 | Japan | 437/101 |
| 0012770 | 1/1985 | Japan | . |
| 0139069 | 6/1986 | Japan | 437/41 |
| 0241377 | 10/1987 | Japan | 437/41 |
| 0091467 | 4/1989 | Japan | 357/23.7 |
| 0124264 | 5/1989 | Japan | 437/41 |
| 0149472 | 6/1989 | Japan | 357/23.7 |
| 2185622 | 7/1987 | United Kingdom | . |

Primary Examiner—Mary Wilczewski
Attorney, Agent, or Firm—Spensley Horn Jubas & Lubitz

[57] ABSTRACT

A thin-film transistor comprises a first amorphous semiconductor layer acting as a channel, a second n+ amorphous semiconductor layer formed on the first amorphous semiconductor layer, a diffusion preventive layer of chromium provided between the second amorphous semiconductor layer and source/drain metal electrodes. The diffusion preventive layer is formed by removing a portion of a diffusion preventive layer forming film not being covered by a patterned resist film using a first etchant. Then, the second amorphous semiconductor layer is formed by removing a portion of a second amorphous semiconductor layer forming film not being covered by the patterned resist film or the diffusion preventive layer using a second etchant which dissolves the second amorphous semiconductor layer forming film but does not dissolve the diffusion preventive layer.

6 Claims, 6 Drawing Sheets

FABRICATION METHOD OF THIN-FILM TRANSISTOR

BACKGROUND OF THE INVENTION

The present invention relates to a method of fabricating a thin-film transistor, and more particularly to an improvement in the fabrication method of a thin-film transistor which can simplify the fabrication process, and can produce transistors with little variation of the on-current and off-current.

As the thin-film transistor of the above kind, there has been known one that are equipped, as shown in FIG. 2 to FIG. 4, with a glass substrate (a), a gate electrode (b) formed on the glass substrate (a), a gate insulating layer (c) that covers the gate electrode (b), a first amorphous semiconductor layer (d) deposited on the gate insulating layer (c), a protective layer (e), as needed, provided on the first amorphous semiconductor layer (d) and at the area corresponding to the gate electrode (b) for protecting the first amorphous semiconductor layer (d), a second amorphous semiconductor layer (f) for ohmic contact formed on the first amorphous semiconductor layer (d) and containing trivalent or pentavalent impurity atoms, source/drain electrodes (g), (h) electrically connected to the second amorphous semiconductor layer (f), and a diffusion preventive layer (j) disposed between each of the source/drain electrodes (g), (h) and the second amorphous semiconductor layer (f) for preventing diffusion of the metal constituting the source/-drain electrodes (g), (h) into the second amorphous semiconductor layer (f). This thin-film transistor is used for driving, for example, an image sensor, electroluminescence display and liquid crystal display.

The conventional method of fabricating such a thin-film transistor has the processes shown in FIG. 5(A) to FIG. 5(J).

Namely, as shown in FIGS. 5(A) and 5(B), on the glass substrate (a) having the gate electrode (b) formed thereon, there are deposited sequentially an $SiN_x$ insulating coating (c') which is to become the gate insulating layer (c), an amorphous silicon (a-Si) semiconductor coating (d') which is to become the first amorphous semiconductor layer (d), and an $SiN_x$ protective coating (e') which is to become the protective layer (e). Then the protective layer (e) is formed as shown in FIG. 5(C) by selectively removing the protective coating (e').

Next, as shown in FIG. 5(D), an amorphous silicon (a-Si) second amorphous semiconductor layer forming film (f') and a chromium (Cr) diffusion preventive layer forming film (j') are deposited sequentially. Then, after forming a resist film ($k_1$) in patterned form on the diffusion preventive layer forming film (j') as shown in FIG. 5(E), an etching is performed using an etchant which is a mixture of ammonium cerium nitrate (IV) and perchloric acid to form the diffusion preventive layer (j) by removing the portion of the diffusion preventive layer forming film (j') not being covered by the resist film ($k_1$). Then, the resist film ($k_1$) is removed to assume the structure shown in FIG. 5(F).

Then, after forming a patterned resist film ($k_2$) again on the diffusion preventive layer (j) as shown in FIG. 5(G), the second amorphous semiconductor layer (f) and the first amorphous semiconductor layer (d) are formed as shown in FIG. 5(H) by removing the portion of the second amorphous semiconductor layer forming film (f') not being covered by the resist film ($k_2$) and the outer portion of the underlying amorphous silicon (a-Si) semiconductor coating (d') by means of an etching that uses a hydrofluoric/nitric acid based etchant.

Further, as shown in FIG. 5(I), the gate insulating layer (c) is formed by selectively removing the $SiN_x$ insulating coating (c') by means of photoetching. Then, as shown in FIG. 5(j), the source/drain electrodes (g), (h) are formed, thereby obtaining the thin-film transistor.

Now, in the conventional method described above, as the etchant for the second amorphous semiconductor layer forming film (f') and the underlying amorphous silicon (a-Si) semiconductor coating (d'), a hydrofluoric/nitric acid based agent is used which can also dissolve chromium and the like used for the diffusion preventive layer (j), so that there is a drawback that if a portion of the diffusion preventive layer (j) is exposed, this portion is also etched at the time of the above-mentioned etching process. Moreover, the resist film that once made a contact with an etchant tends to suffer from the side etching, and therefore, it is necessary to form again the new resist film ($k_2$) on the diffusion preventive layer (j) as shown in FIG. 5(G).

Therefore, there occurs a problem that the number of fabrication processes must be increased owing to the necessity of two times of the resist film formation processes. Moreover, there is another problem that the operability is diminished due to the requirement that the resist film must be formed on the diffusion preventive layer (j) with high accuracy.

Further, when the position of formation of the resist films ($k_2$) is deviated to one side due to misalignment as shown in FIG. 6(A), the second amorphous semiconductor layer (f) is formed such that its one end portion extends toward the center of the protective layer (e), with a result that one of the source/drain electrodes (g), (h) and the second amorphous semiconductor layer (f) are connected directly in one portion without an intermediary of the diffusion preventive layer (j). This causes a problem that the on-current and off-current of thin-film transistors obtained have variations depending on an area of the direct connection.

The inventor considers based on his analysis that the above variations are due to the following reasons.

First, when the source/drain electrodes (g), (h) and the second amorphous semiconductor layer (f) are connected directly, the resistance of the second amorphous semiconductor layer (f) is reduced if the metal constituting the electrodes (g), (h) diffuses into the second amorphous semiconductor layer (f). On the contrary, if a portion of the second amorphous semiconductor layer (f) is exposed and is oxidized during the etching process, then its resistance will be increased. In this manner, the condition of electrical connection between the source/-drain electrodes (g), (h) and the second amorphous semiconductor layer (f) becomes unstable, so that the electrical connection condition is likely to change even with a slight variation in fabrication conditions.

Further, in the thin-film transistor with the protective layer (e) as shown in FIG. 7, when a voltage is applied between the source/drain electrodes (g) and (h), there is formed an additional channel which serves as a current path in the boundary between the protective layer (e) and the first amorphous semiconductor layer (d) depending upon the kind of material forming the protective layer (e), with a result that the protective layer (e) sometimes traps electrons. Under these circumstances, if there exists a variation in the condition of electrical connection between the source/drain electrodes (g), (h) and the second amorphous semiconductor layer (f) among individual transistors fabricated, then quantity of the electrons trapped by the protective layer (e) will be varied accordingly, causing a variation of current flowing through the first amorphous semiconductor layer (d). This is also considered to contribute to the dispersion of the on-current and off-current among individual thin-film transistors that are fabricated.

On the other hand, in the thin-film transistor with no protective layer as shown in FIG. 8, if there is a variation among individual transistors in the condition of electrical connection between the source/drain electrodes (g), (h) and the second amorphous semiconductor layer (f), then quantity of the electrons trapped in the first amorphous semiconductor layer (d) varies in accordance with a variation in the effective gate length ($\alpha$), causing a variation of current flowing through the first amorphous semiconductor layer (d). This is also considered to be responsible for the dispersion of the on-current and off-current.

SUMMARY OF THE INVENTION

The present invention was motivated in view of the aforementioned problems, and it is, therefore, an object of the present invention is to provide a method of fabricating a thin-film transistor which can simplify the fabrication process and can reduce variation of the on-current and off-current among individual thin-film transistors fabricated.

An embodiment of the present invention is applied to a method of fabricating a thin-film transistor equipped with an insulating substrate, a gate electrode formed on the substrate, a gate insulating layer which covers the gate electrode, a first amorphous semiconductor layer formed on the gate insulating layer, a second amorphous semiconductor layer containing trivalent or pentavalent impurity atoms and formed on the first amorphous semiconductor layer, source/drain electrodes electrically connected to the second amorphous semiconductor layer, and a diffusion preventive layer provided between the source/drain electrodes and the second amorphous semiconductor layer for preventing diffusion of the metal constituting the source/drain electrodes into the second amorphous semiconductor layer. An improvement is characterized by the steps of:

- depositing a diffusion preventive layer forming film on a second amorphous semiconductor layer forming film;
- forming a patterned resist film on the diffusion preventive layer forming film;
- forming the diffusion preventive layer by removing a portion of the diffusion preventive layer forming film not being covered by the patterned resist film by dissolving the portion with a first etchant; and
- forming the second amorphous semiconductor layer by removing a portion of the second amorphous semiconductor layer forming film not being covered by the patterned resist film or the diffusion preventive layer by dissolving the portion with a second etchant which dissolves the second amorphous semiconductor layer forming film but does not dissolve the diffusion preventive layer.

By virtue of using the etchant which does not dissolve the diffusion preventive layer in the second removal process, the diffusion preventive layer will not be reduced regardless of the presence or absence of the resist film. Accordingly, it becomes possible to eliminate the second resist film formation process after the first removal process. Furthermore, since the edges of the diffusion preventive layer and the second amorphous semiconductor layer can be aligned, there will not occur a case in which the source/drain electrodes and the second amorphous semiconductor layer are connected directly in a portion. Therefore, it becomes possible to prevent the variation of the condition of electrical connection between the source/drain electrodes and the second amorphous semiconductor layer.

DETAILED DESCRIPTION OF THE INVENTION

Figure 1A:
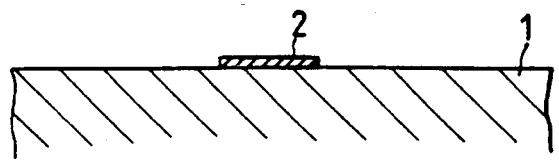
FIGS. 1(A) to 1(J) are process diagrams for explaining the fabrication method of a thin-film transistor in accordance with an embodiment of the present invention.

Referring to the drawings, an embodiment of the present invention will be described in detail in what follows.

Figure 1B:
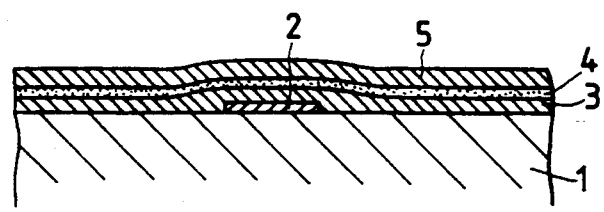

First, as shown in FIG. 1(A), a 500 Å-thick chromium (Cr) gate electrode 2 is deposited on a transparent glass substrate 1 (trade name: Corning 7059) by means of sputtering and photoetching. Then, a 3000 Å-thick amorphous silicon nitride ($SiN_x$) film 3 for gate insulation, a 1000 Å-thick amorphous silicon (a-Si) semiconductor coating 4 for a first amorphous semiconductor layer and a 1500 Å-thick amorphous silicon nitride ($SIN_x$) protective coating 5 for a protective layer are deposited in succession by means of plasma CVD (chemical vapor deposition) under a vacuum condition, as shown in FIG. 1(B).

Figure 1C:
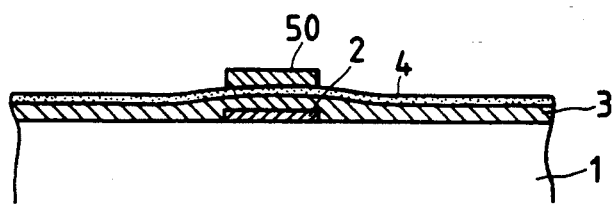

Next, a photoresist film (positive type resist material manufactured by Tokyo Ohka Kogyo Co., trade name: OFPR-800) is spin-coated uniformly on the protective coating 5 in a state where the vacuum condition is canceled. After subjecting the photoresist film to a patterned exposure to ultraviolet rays via a glass mask (not shown) by means of a reduction-projecting stepper device to alter the irradiated portion to become soluble to a developer, a patterned resist film (not shown) is formed by dissolving and removing the irradiated portion with a developer (nonmetallic developer manufactured by Tokyo Ohka Kogyo Co., trade name: NMD-3). Further, the exposed portion of the protective coating 5 is dissolved and removed by BHF (buffered hydrofluoric acid which is a mixture of hydrofluoric acid and ammonium fluoride with a mixing weight ratio of 1:50). Removing the patterned resist film, there is formed a protective layer 50 as shown in FIG. 1(C).

Figure 1D:
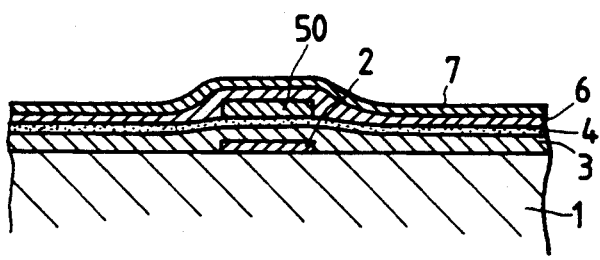
Figure 1E:
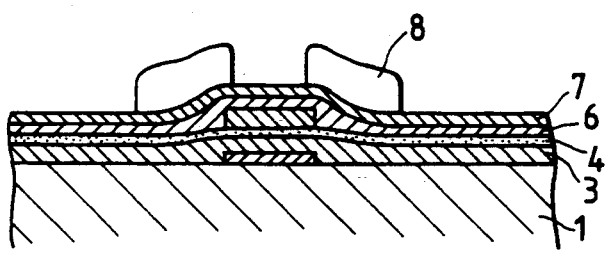

Then, the surface of the substrate 1 with the protective layer 50 formed thereon is subjected to an oxide film removal treatment, a cleaning treatment and the like. Then, after bringing the substrate into a chamber filled with gaseous nitrogen for CVD treatment and evacuating the chamber to a vacuum condition, a 1000 Å-thick, n+-amorphous-silicon (a-Si) second amorphous semiconductor layer forming film 6 containing pentavalent phosphorus (P) atoms and a 1500 Å-thick chromium (Cr) diffusion preventive layer forming film 7 are successively deposited by means of the plasma CVD process (see FIG. 1(D)). In this case, the second amorphous semiconductor layer forming film 6 is deposited on the amorphous silicon semiconductor coating 4 using a mixed gas of phosphine ($PH_3$) and silane ($SiH_4$).

Figure 1F:
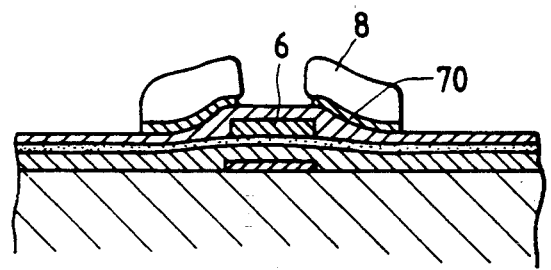

Subsequently, a patterned resist film 8 is formed on the diffusion preventive layer forming film 7 by the method similar to that used in formation of the resist film described above, under the condition in which the vacuum condition is canceled. The product is subjected to an etching treatment which uses an etchant consisting of a mixture of ammonium cerium nitrate (IV) and perchloric acid to form a diffusion preventive layer 70 by removing the portion of the diffusion preventive layer forming film 7 not being covered by the resist film 8, as shown in FIG. 1(F).

Figure 1G:
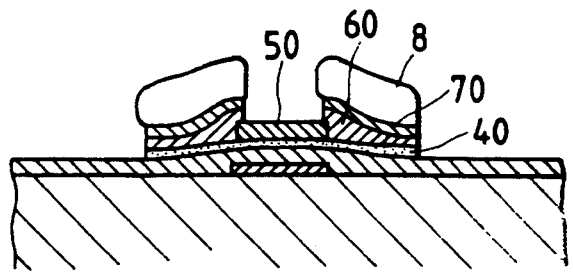
Figure 1H:
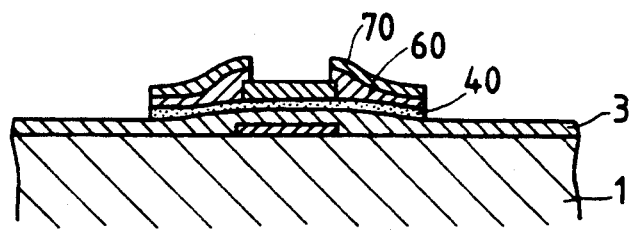

Next, another etching treatment is performed by the use of a phosphoric acid based etchant (mixed solution of phosphoric acid, nitric acid and hydrofluoric acid) with the resist film 8 intact, as shown in FIG. 1(G), to form a second amorphous semiconductor layer 60 and a first amorphous semiconductor layer 40 by removing the portion of the second amorphous semiconductor layer forming film 6 not being covered by the resist film 8 and the outer portion of the amorphous silicon semiconductor coating 4. Then, the resist film 8 is removed so that the substrate assumes the structure shown in FIG. 1(H).

Figure 1I:
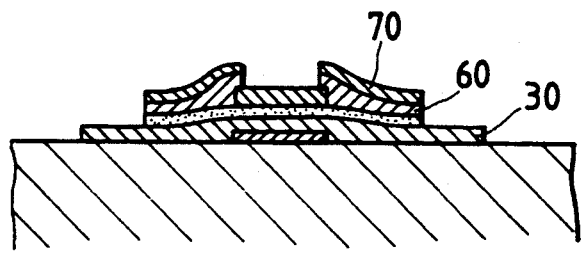

Then, a gate insulating layer 30 is formed by selectively removing the amorphous silicon nitride ($Si_3N_4$) insulating coating 3 by means of the photoetching similar to that used in the conventional method, as shown in FIG. 1(I).

Figure 1J:
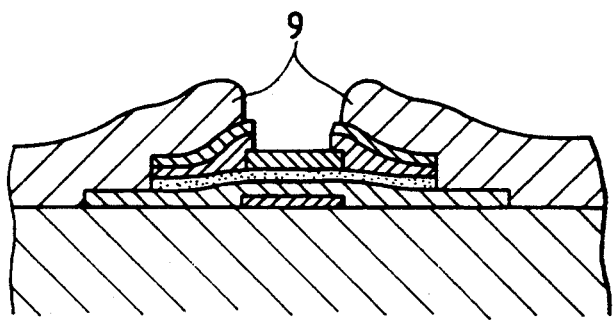
Figure 2:
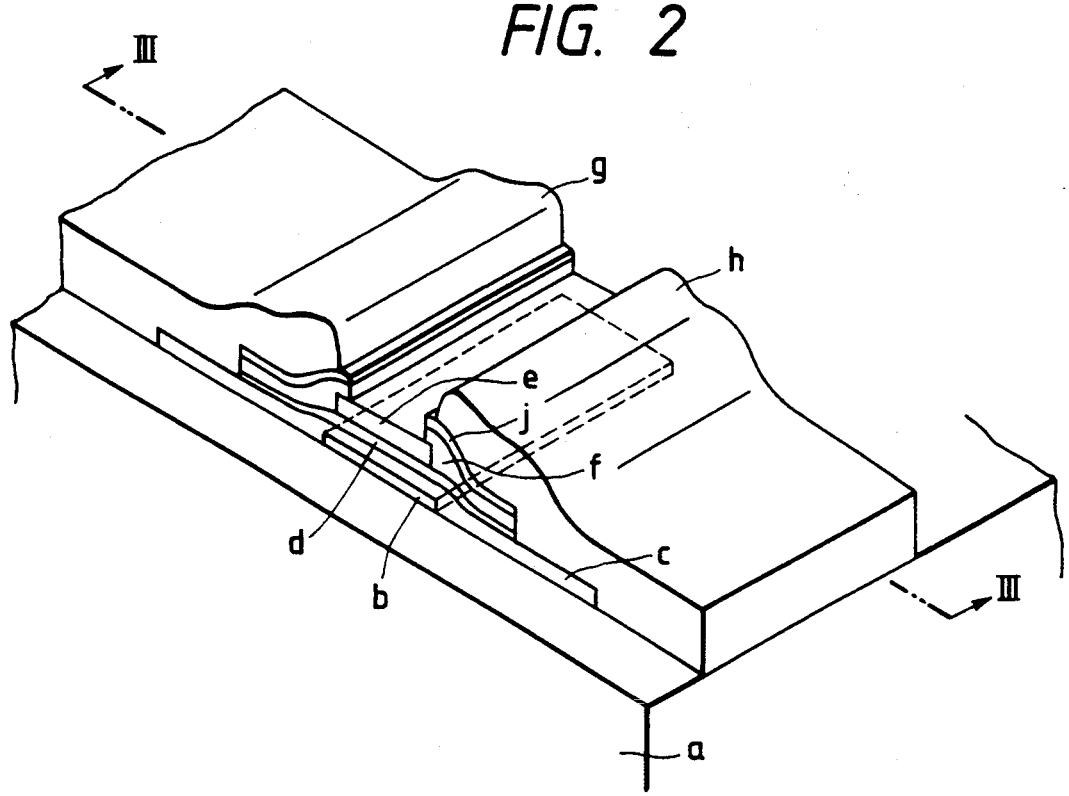
FIG. 2 is a schematic perspective view of the thin-film transistor.
Figure 3:
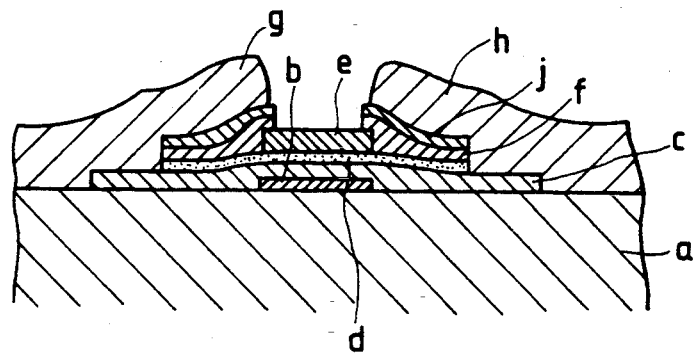
FIG. 3 is a sectional diagram taken along the line III—III in FIG. 2.
Figure 4:
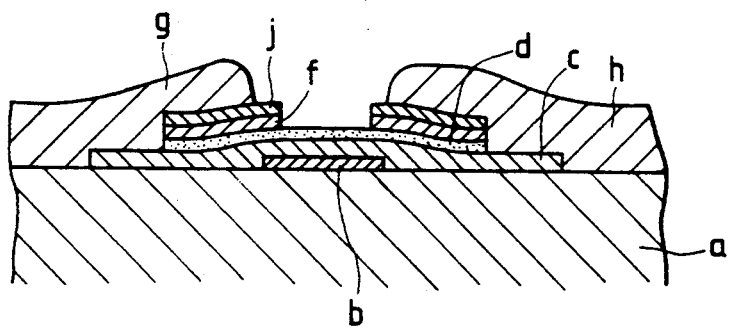
FIG. 4 is a sectional diagram of a thin-film transistor with no protective layer.
Figure 5A:
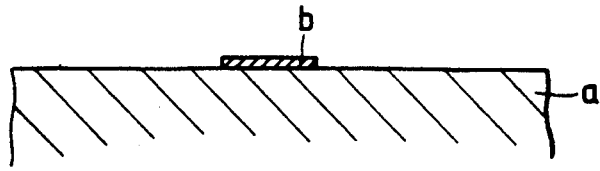
FIGS. 5(A) to 5(J) are process diagrams for explaining a conventional fabrication method of a thin-film transistor.
Figure 5B:
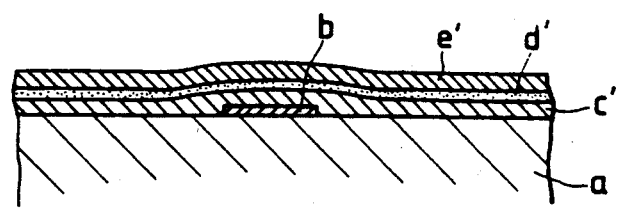
Figure 5C:
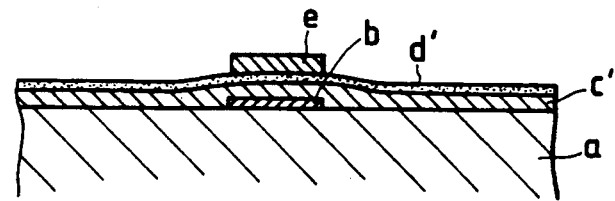
Figure 5D:
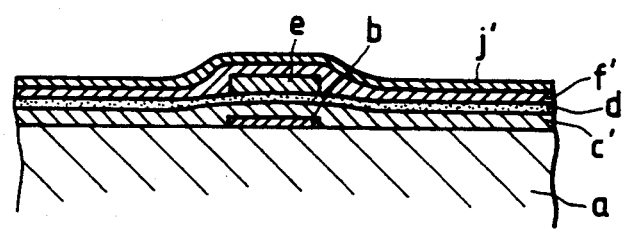
Figure 5E:
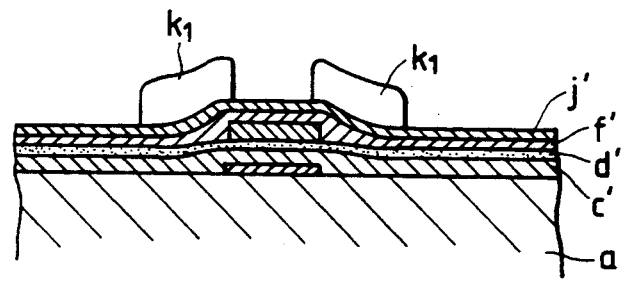
Figure 5F:
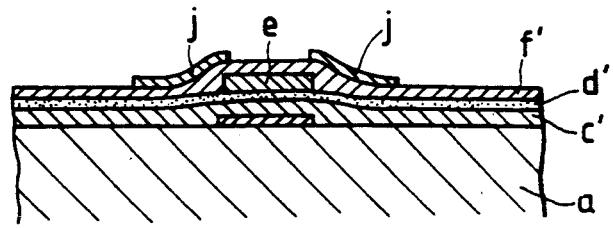
Figure 5G:
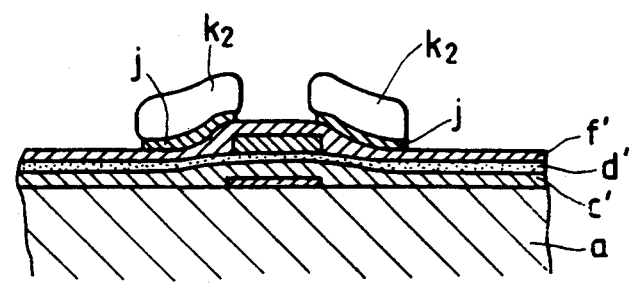
Figure 5H:
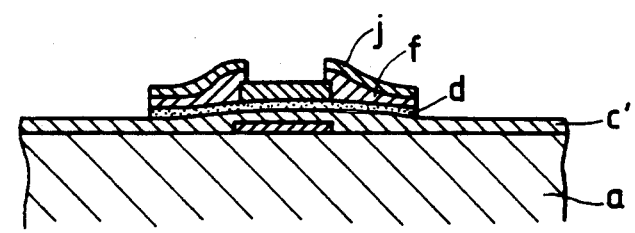
Figure 5I:
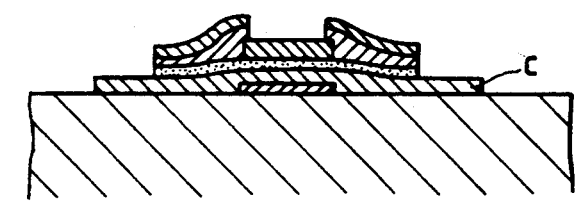
Figure 5J:
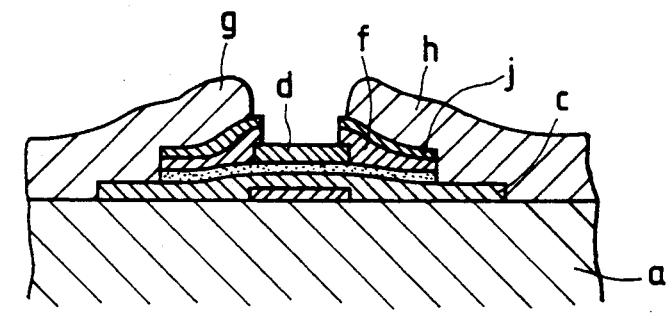
Figure 6A:
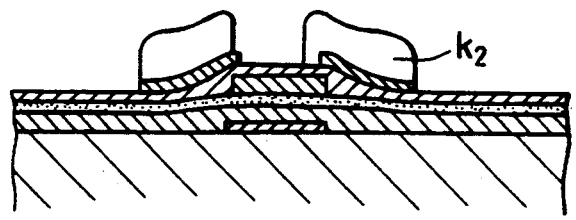
FIGS. 6(A) and 6(B) are diagrams for explaining drawbacks of the conventional method.
Figure 6B:
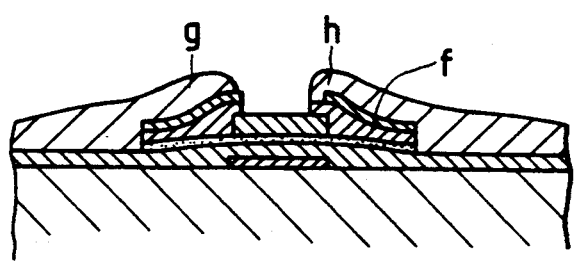
Figure 7:
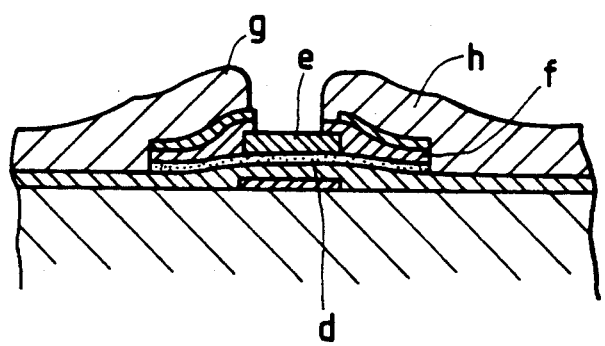
FIGS. 7 and 8 are sectional views of thin-film transistors fabricated by the conventional method.
Figure 8:
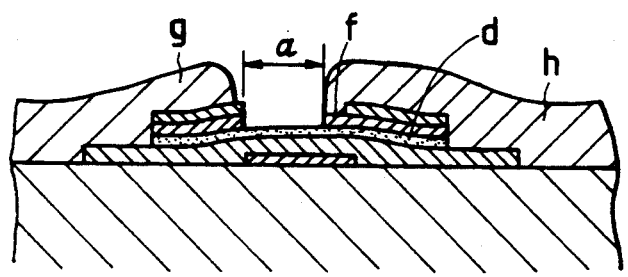

Further, a 1 μm-thick aluminum (Al) layer for source/drain electrodes is deposited uniformly all over the surface of the substrate 1 by sputtering, and a thin-film transistor is obtained as shown in FIG. 1(J) by forming source/drain electrodes 9 by selectively removing aluminum (Al) layer by means of the photoetching similar to that in the conventional method.

As described above, in the fabrication method in accordance with this embodiment, a phosphoric acid based etchant is used, which does not dissolve chromium that constitutes the diffusion preventive layer 70, as the etchant for the second amorphous semiconductor layer forming film 6 provided beneath the diffusion preventive layer 70. Therefore, the diffusion preventive layer 70 will not be etched in the second removal process for etching the second amorphous semiconductor layer forming film 6 regardless of the presence or absence of the resist film 8.

As a result, after the first removal process for etching the diffusion preventive layer forming film 7, there is no need to form a resist film for the second time as in the conventional method, which has an advantage that the number of fabrication steps can be diminished.

Moreover, since the etching of the second amorphous semiconductor layer forming film 6 is performed, with the resist film 8 formed on the diffusion preventive layer 70 as a mask or the diffusion preventive layer 70 beneath the resist film 8 as a mask, after the second removal process, the edges of the diffusion preventive layer 70 and the second amorphous semiconductor layer 60 are aligned and there will occur no partial direct connection between the source/drain electrodes 9 and the second amorphous semiconductor layer 60. Therefore, variations in the condition of electrical connection between the source/drain electrodes 9 and the second amorphous semiconductor layer 60 will not occur, obtaining an advantage of eliminating variation of the on-current and off-current in the thin-film transistors fabricated.

According to measurements on the range of dispersion of the on-current and off-current for a plurality of thin-film transistors obtained by this embodiment, it was found that the variation range was 15 to 25 μA for the on-current and 50 to 200 pA for the off-current. Therefore, compared with the corresponding ranges for thin-film transistors fabricated by the conventional method, namely, 10 to 30 μA for the on-current and 50 to 500 pA for the off-current, it was confirmed that the dispersion was reduced markedly from that with the conventional method.

Hereinafter, descriptions will be made as to materials for the respective elements constituting the thin-film transistor, etchants, alternative processes, etc.

Glass, ceramic, polyimide resin or the like may be used for the insulating substrate, and amorphous silicon, polycrystalline silicon or the like may be used for the first and second amorphous semiconductor layers.

As the impurity atoms to be mixed in the second amorphous semiconductor layer for ohmic contact, there may be used such trivalent atoms as gallium (Ga), boron (B), indium (In) and aluminum (Al) and such pentavalent atoms as phosphorus (P), antimony (Sb) and arsenic (As).

As the metallic material which constitutes the source/drain electrodes, there may be used aluminum, chromium (Cr), titanium (Ti), tungsten (W), molybdenum (Mo), tantalum (Ta), copper (Cu) and the like. Further, as the material for the diffusion preventive layer to be disposed between the source/drain electrodes and the second amorphous semiconductor layer, there may be used chromium, titanium, tungsten, molybdenum, tantalum and the like.

As the etchant for removing the diffusion preventive layer of chromium in the first removal process, besides the conventional etchant consisting of a mixture of ammonium cerium nitrate (IV) and perchloric acid, chloric acid may be used. On the other hand, as the etchant in the second removal process which dissolves the second amorphous semiconductor layer forming film but does not dissolve the diffusion preventive layer, there may be used a phosphoric acid based etchant such as a mixed solution of phosphoric acid, nitric acid and hydrofluoric acid. It should be mentioned that in these removal processes, a dry etching process can be employed as well as a wet etching process.

Moreover, as to the resist film which was exposed to the etchant at the time of the first removal process, it may be further subjected to the etching in the second removal process, or, alternatively, it may be removed to expose the diffusion preventive layer in the second removal process.

It is noted that the conventional methods for forming the gate electrode, gate insulating layer, and source/drain electrodes may be applied as they are.

What is claimed is:

1. In a method of fabricating a thin-film transistor which comprises an insulating substrate, a gate electrode formed on the substrate, a gate insulating layer covering the gate electrode, a first amorphous semiconductor layer formed on the gate insulating film, a second amorphous semiconductor layer containing trivalent or pentavalent impurity atoms and formed on the first amorphous semiconductor layer, source and drain electrodes electrically connected to the second amorphous semiconductor layer, and a diffusion preventive layer provided between each of the source and drain electrodes and the second amorphous semiconductor layer for preventing diffusion of metal constituting the source and drain electrodes into the second amorphous semiconductor layer, the improvement comprising the steps of:

(a) depositing a film of a diffusion preventive material on a film of a second amorphous semiconductor material;

(b) forming a patterned resist film on said film of diffusion preventive material;

(c) forming the diffusion preventive layer by removing a portion of said film of diffusion preventive material not being covered by said patterned resist film by dissolving said portion with a first etchant; and (d) forming the second amorphous semiconductor layer by removing a portion of a film of a second amorphous semiconductor material not being covered by the diffusion preventive layer by dissolving said portion with a second etchant which dissolves said film of second amorphous semiconductor material but does not dissolve the diffusion preventive layer, wherein said second etchant is a phosphoric-acid-based etchant.

2. The method according to claim 1, wherein said phosphoric-acid-based etchant is a mixed solution of phosphoric acid, nitric acid, and hydrofluoric acid.

3. The method according to claim 1, wherein the diffusion preventive layer is composed of chromium.

4. A method of fabricating a thin-film transistor of the type having a substrate, a gate electrode adjacent the substrate, a gate insulating layer covering the gate electrode, a first amorphous semiconductor layer adjacent the gate insulating film, a second amorphous semiconductor layer adjacent the first amorphous semiconductor layer, source and drain electrodes electrically connected to the second amorphous semiconductor layer, and a diffusion preventive layer provided between each of the source and drain electrodes and the second amorphous semiconductor layer for preventing diffusion of metal of the source and drain electrodes into the second amorphous semiconductor layer, the method comprising the steps of:

forming a film of a first amorphous semiconductor material adjacent the gate insulating layer and a film of a second amorphous semiconductor material adjacent the film of first amorphous semiconductor material;

forming a film of a diffusion preventive material adjacent the film of second amorphous semiconductor material;

forming a patterned resist film adjacent the film of diffusion preventive material;

forming the diffusion preventive layer by removing a portion of said film of diffusion preventive material not being covered by said patterned resist film by dissolving said portion with a first etchant; and forming the first and second amorphous semiconductor layers by removing a portion of each of the films of first and second amorphous semiconductor materials not being covered by the diffusion preventive layer by dissolving said film portion with a second etchant which dissolves said first and second amorphous semiconductor materials but does not dissolve the diffusion preventive layer, wherein said second etchant is a phosphoric-acid-based etchant.

5. The method according to claim 4, wherein said phosphoric-acid-based etchant is a mixed solution of phosphoric acid, nitric acid, and hydrofluoric acid.

6. The method according to claim 4, wherein the diffusion preventive layer is composed of chromium.

* * * * *